United States Patent
Bedell et al.

(10) Patent No.: US 9,105,518 B2
(45) Date of Patent: Aug. 11, 2015

(54) METHOD OF LARGE-AREA CIRCUIT LAYOUT RECOGNITION

(71) Applicant: International Business Machines Corporation, Armonk, NY (US)

(72) Inventors: Stephen W. Bedell, Wappingers Falls, NY (US); Bahman Hekmatshoar-Tabari, White Plains, NY (US); Ali Khakifirooz, Mountain View, CA (US); John A. Ott, Greenwood Lake, NY (US); Ghavam G. Shahidi, Round Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 42 days.

(21) Appl. No.: 14/063,579

(22) Filed: Oct. 25, 2013

(65) Prior Publication Data
US 2014/0051190 A1  Feb. 20, 2014

Related U.S. Application Data

(63) Continuation of application No. 13/555,261, filed on Jul. 23, 2012, now Pat. No. 8,592,323, which is a continuation of application No. 13/530,605, filed on Jun. 22, 2012, now Pat. No. 8,530,337.

(51) Int. Cl.
*H01L 21/469* (2006.01)
*H01L 21/66* (2006.01)
(Continued)

(52) U.S. Cl.
CPC .............. *H01L 22/12* (2013.01); *H01L 21/304* (2013.01); *H01L 21/7806* (2013.01); *H01L 21/7813* (2013.01)

(58) Field of Classification Search
CPC ................................................. H01L 2224/16
See application file for complete search history.

(56) References Cited

U.S. PATENT DOCUMENTS

| | | |
|---|---|---|
| 6,682,990 B1 | 1/2004 | Iwane et al. |
| 6,802,926 B2 | 10/2004 | Mizutani et al. |

(Continued)

OTHER PUBLICATIONS

FEI Company (Magellan XHR Scanning Electron Microscope Brochure, 2008, accessed from fei.com/magellan).*

(Continued)

*Primary Examiner* — Zandra Smith
*Assistant Examiner* — Andre' C Stevenson
(74) *Attorney, Agent, or Firm* — Scully, Scott, Murphy & Presser, P.C.; Louis J. Percello, Esq.

(57) ABSTRACT

Methods for detecting the physical layout of an integrated circuit are provided. The methods of the present disclosure allow large area imaging of the circuit layout without requiring tedious sample preparation techniques. The imaging can be performed utilizing low-energy beam techniques such as scanning electron microscopy; however, more sophisticated imaging techniques can also be employed. In the methods of the present disclosure, spalling is used to remove a portion of a semiconductor layer including at least one semiconductor device formed thereon or therein from a base substrate. In some cases, a buried insulator layer that is located beneath a semiconductor layer including the at least one semiconductor device can be completely or partially removed. In some cases, the semiconductor layer including the at least one semiconductor device can be thinned. The methods improve the detection quality that the buried insulator layer and a thick semiconductor layer can reduce.

15 Claims, 9 Drawing Sheets

(51) Int. Cl.
*H01L 21/304* (2006.01)
*H01L 21/78* (2006.01)

(56) References Cited

U.S. PATENT DOCUMENTS

| | | |
|---|---|---|
| 8,530,337 B1 | 9/2013 | Bedell et al. |
| 2001/0055854 A1 | 12/2001 | Nishida et al. |
| 2008/0128868 A1* | 6/2008 | Aspar ............................ 257/629 |
| 2010/0307572 A1 | 12/2010 | Bedell et al. |
| 2010/0307591 A1 | 12/2010 | Bedell et al. |
| 2010/0311250 A1* | 12/2010 | Bedell et al. .................. 438/759 |
| 2012/0305987 A1* | 12/2012 | Hirler et al. ................... 257/192 |
| 2013/0320423 A1* | 12/2013 | Beaudoin et al. ............. 257/301 |

OTHER PUBLICATIONS

Quirk et al., (Semiconductor Manufacturing Technology, Prentice-Hall Inc., Upper Saddle River, New Jersey, 2001).*
Office Action dated Feb. 19, 2013 received in a related U.S. Appl. No. 131530,605.
Notice of Allowance dated May 7, 2013 received in related U.S. Appl. No. 13/530,605.
Quirk, M. et al., "Semiconductor Manufacturing Technology" 2001, Prentice Hall Inc.
FEI Company, Magellan XHR brochure, 2008, pp. 1-8, fei.com/magellan.
U.S. Office Action dated Feb. 27, 2014 issued in U.S. Appl. No. 14/021,527.

* cited by examiner

METHOD OF LARGE-AREA CIRCUIT LAYOUT RECOGNITION

CROSS REFERENCE TO RELATED APPLICATION

This application is a continuation of U.S. patent application Ser. No. 13/555,261, filed Jul. 23, 2012, which is a continuation of U.S. patent application Ser. No. 13/530,605, filed Jun. 22, 2012, now U.S. Pat. No. 8,530,337, issued Sep. 10, 2013, the entire content and disclosure of each is incorporated herein by reference.

BACKGROUND

The present disclosure relates to semiconductor manufacturing, and more particularly to methods for detecting a layout of an integrated circuit located upon a semiconductor substrate.

Integrated circuit (IC) layout is the representation of an IC in terms of planar geometric shapes which correspond to patterns of semiconductor material, insulator material and/or conductive material that constitute the IC. For many applications, it is necessary to detect the actual physical circuit layout on a semiconductor chip. For various applications, the level of detection may vary. However, there are specific applications whereby the comparison of the actual layout to the corresponding design layout is essential for verification of the integration process.

The majority of the conventional techniques use back-polishing semiconductor wafers down to a tens or microns in conjugation with extremely high energy beam imaging, or electron back-scattering techniques to detect the physical layout of the semiconductor chip. Nonetheless, none of the prior art techniques provide enough resolution for discerning various layers/components of the semiconductor chip. As such, alternative techniques are needed that can be used to detect a layout of an IC.

SUMMARY

Methods for detecting the physical layout of an integrated circuit are provided. The methods of the present disclosure allow large area imaging of the circuit layout without requiring tedious sample preparation techniques. The imaging can be performed utilizing low-energy beam techniques such as scanning electron microscopy; however, more sophisticated imaging techniques can also be employed. In the methods of the present disclosure, spalling is used to remove a portion of a semiconductor layer including at least one semiconductor device formed thereon or therein from a base substrate. In some cases, a buried insulator layer that is located beneath a semiconductor layer including the at least one semiconductor device can be completely or partially removed. In some cases, the semiconductor layer including the at least one semiconductor device can be thinned. The methods improve the detection quality that the buried insulator layer and a thick semiconductor layer can reduce.

In one embodiment of the present disclosure a method for enhancing the recognition of an integrated circuit is provided. In this embodiment, the method includes providing a semiconductor-on-insulator substrate including a stack, from bottom to top, of a base substrate, a buried insulator layer, and a top semiconductor active layer, wherein an interface is present between a topmost surface of the buried insulator layer and a bottommost surface of the top semiconductor active layer. Next, at least one semiconductor device-containing region comprising at least one semiconductor device formed on and/or within a portion of the top semiconductor active layer is formed. At least a stressor layer is then formed on an exposed surface of the at least one semiconductor device-containing region, wherein the stressor layer has a fracture toughness that is greater than that of the base substrate. A flexible handle layer is then applied on an exposed surface of the stressor layer. A material base layer is then removed from the base substrate by controlled spalling, wherein the material base layer is located on a bottommost surface of the buried insulator layer. The material base layer is then removed from the bottommost surface of the buried insulator layer. The buried insulator layer is then partially or completely removed and thereafter the at least one semiconductor device-containing region including the at least one semiconductor device is subjected to imaging.

In another embodiment, another method for enhancing the recognition of an integrated circuit is provided. This method includes forming at least one semiconductor device-containing region comprising at least one semiconductor device formed on and/or within a portion of a semiconductor substrate. Next, at least a stressor layer is provided on an exposed surface of the at least one semiconductor device-containing region, wherein the stressor layer has a fracture toughness that is greater than that of the semiconductor substrate. A flexible handle layer is then applied on an exposed surface of the stressor layer. A material semiconductor layer is then removed from the semiconductor substrate by controlled spalling, wherein the material semiconductor layer is attached to the at least one semiconductor device-containing region. The at least one semiconductor device-containing region including the at least one semiconductor device is then imaged.

In another embodiment, other material characterization techniques can be applied to detect different information from the back of the circuit including material composition and strain type and level.

DETAILED DESCRIPTION

Figure 1:
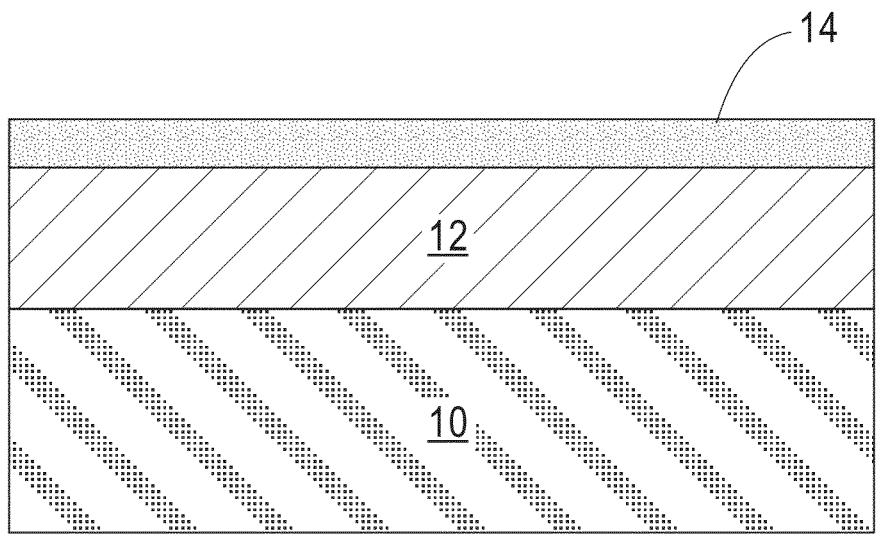
FIG. 1 is a pictorial representation (through a cross sectional view) illustrating an initial semiconductor-on-insulator (SOI) substrate including a stack, from bottom to top, of a base substrate, a buried insulator layer, and a top semiconductor active layer that can be used in one embodiment of the present disclosure.

The present disclosure, which provides methods for enhancing the detection of the physical layout of an integrated circuit located upon a semiconductor substrate, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

Referring first to FIG. 1, there is illustrated an initial semiconductor substrate that can be used in one embodiment of the present disclosure. In one embodiment and as shown in FIG. 1, the initial semiconductor substrate can be a semiconductor-on-insulator (SOI) substrate. The SOI substrate that can be employed in the present disclosure includes a stack, from bottom to top, of a base substrate 10, a buried insulator layer 12, and a top semiconductor active layer 14. As shown, a bottommost surface of the buried insulator layer 12 forms a first interface with a topmost surface of the base substrate 10, and the topmost surface of the buried insulator layer 12 forms a second interface with a bottommost surface of the top semiconductor active layer 14. The top semiconductor active layer 14 is the portion of the SOI substrate in which various semiconductor devices can be formed thereon and/or therein.

The base substrate 10 typically includes, but is not limited to, a semiconductor material. In some embodiments, the base substrate 10 can be a material other than a semiconductor material such as, for example, a glass, and/or a ceramic. When a glass is used as the base substrate 10, the glass can be an $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass. When the base substrate 10 comprises a ceramic, the ceramic can be any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

The buried insulator layer 12 includes a dielectric material such as, for example, silicon dioxide, silicon nitride, boron nitride, a dielectric metal oxide (including metal oxides having a dielectric constant of greater than 3.9), or a combination thereof. The top semiconductor active layer 14 (herein after referred to just as SOI layer 14) includes a semiconductor material, which may be the same as, or different from, the semiconductor material of the base substrate 10.

When the base substrate 10 is comprised of a semiconductor material, each of the base substrate 10 and the SOI layer 14 includes a semiconductor material independently selected from elemental semiconductor materials (e.g., silicon, germanium, carbon, or alloys thereof), III-V semiconductor materials, or II-VI semiconductor materials. Each semiconductor material for the base substrate 10 and the SOI layer 14 can be independently single crystalline, polycrystalline, or amorphous. In one embodiment, the base substrate 10 and the SOI layer 14 are single crystalline semiconductor materials. In one embodiment, the base substrate 10 and the top SOI layer 14 include single crystalline silicon.

In one embodiment, the base substrate 10 and/or the SOI layer 14 can be doped with dopants of a first conductivity type. The first conductivity type can be p-type or n-type.

In one embodiment, the thickness of the SOI layer 14 can be from 2 nm to 3000 nm, the thickness of the buried insulator layer 12 can be from 50 nm to 1,000 nm, and the thickness of the base substrate 10 can be from 50 microns to 2 mm, although lesser and greater thicknesses can also be employed for each of these layers. In one embodiment, and when an ETSOI device is to be formed, the SOI layer 14 can have a thickness from 2 nm to 30 nm.

In another embodiment, the initial semiconductor substrate that can be employed in the present disclosure is a bulk semiconductor substrate, i.e., a semiconductor substrate that does not include any buried insulator layer therein. The bulk semiconductor substrate can be represented by the structure shown in FIG. 1 minus the buried insulator layer 12. In such an embodiment, the base substrate 10 is comprised of a same or different, typically, a same semiconductor material as that of the SOI layer 14.

Figure 2:
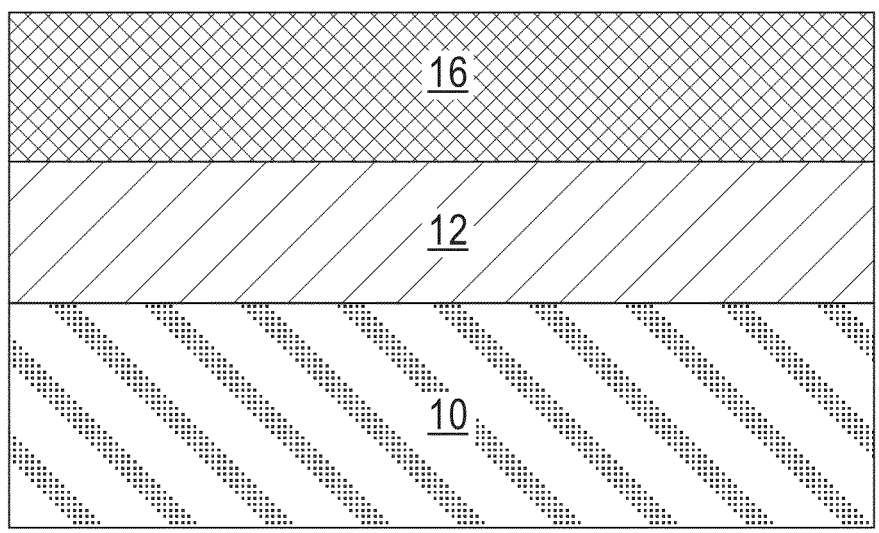
FIG. 2 is a pictorial representation (through a cross sectional view) illustrating the SOI substrate of FIG. 1 after forming at least one semiconductor device-containing region comprising at least one semiconductor device formed on and/or within the top semiconductor active layer of the SOI substrate.

Referring now to FIG. 2, there is illustrated the semiconductor substrate of FIG. 1 after forming at least one semiconductor device-containing region 16. The at least one at least one semiconductor device-containing region 16 may include any number of active and/or passive semiconductor devices including, for example, transistors, capacitors, diodes, BiCMOS, resistors, memory devices, etc. processed on and/or within the uppermost surface of the SOI layer 14. At least a portion of SOI layer 14 remains (see, FIGS. 6-8B, for example) within the at least one semiconductor device-containing region 16 and is present directly on a surface of the buried insulator layer 12 and thus there remains a buried insulator layer/SOI layer interface within the disclosed structure. Some portions of the SOI layer 14 can be used as components of the semiconductor device. For example, a portion of the SOI layer 14 can serve as a channel region of a field effect transistor and other portions of the SOI layer can serve as a source region and a drain region of the field effect transistor. As known to those skilled in the art, the source and drain regions are located adjacent the channel region and at a footprint of a patterned gate region.

When a bulk semiconductor substrate is employed, the at least one semiconductor device-containing region 16 is formed atop the bulk semiconductor and at least an upper portion of the bulk semiconductor substrate can include the at least one semiconductor device formed thereon or therein. In some embodiments, well regions, such as a p-well can be formed into the bulk semiconductor substrate and can be used as an end-point detection means for a subsequent etching process that removes a portion of the bulk semiconductor substrate that is located beneath the upper portion of the bulk semiconductor substrate. In other embodiments, the source and drain regions can include embedded semiconductor materials whose lattice constant differs from that of the bulk semiconductor substrate. The embedded semiconductor materials can be used as an end-point detection means for a subsequent etching process that removes a portion of the bulk semiconductor substrate that is located beneath the upper portion of the bulk semiconductor substrate. The p-well and embedded source/drain regions can also be used in a similar manner with partially depleted SOI devices. Some of these embodiments of the present disclosure will be exemplified in greater detail herein below.

The at least one semiconductor device is not shown in some of the drawings of the present disclosure so as to not obscure the method of the present disclosure. Moreover, one skilled in the art would known the various components of the at least one semiconductor device and how such devices can be formed. Moreover, one skilled in the art would understand that the at least one semiconductor device is formed on and/or within at least a portion of the SOI layer 14 (or an upper portion of a bulk semiconductor substrate). Various device regions can be partitioned by an isolation region as also known to those skilled in the art. Also, the SOI layer 14 is not shown in FIGS. 2-5 so as to not diminish the processing steps illustrated in those drawings.

The active and/or passive devices can be located beneath one or more interconnect structures as are well known to those skilled in the art. In one embodiment, the at least one semiconductor device-containing region 16 may include a complementary metal oxide semiconductor (CMOS) circuit including at least one first transistor of a first conductivity and at least one second transistor of a second conductivity, wherein the first conductivity and the second conductivity differ. In other embodiments, a plurality of semiconductor device-containing regions 16 can be formed vertically stacked one atop the other providing a three-dimensional stack of semiconductor circuits.

Figure 3:
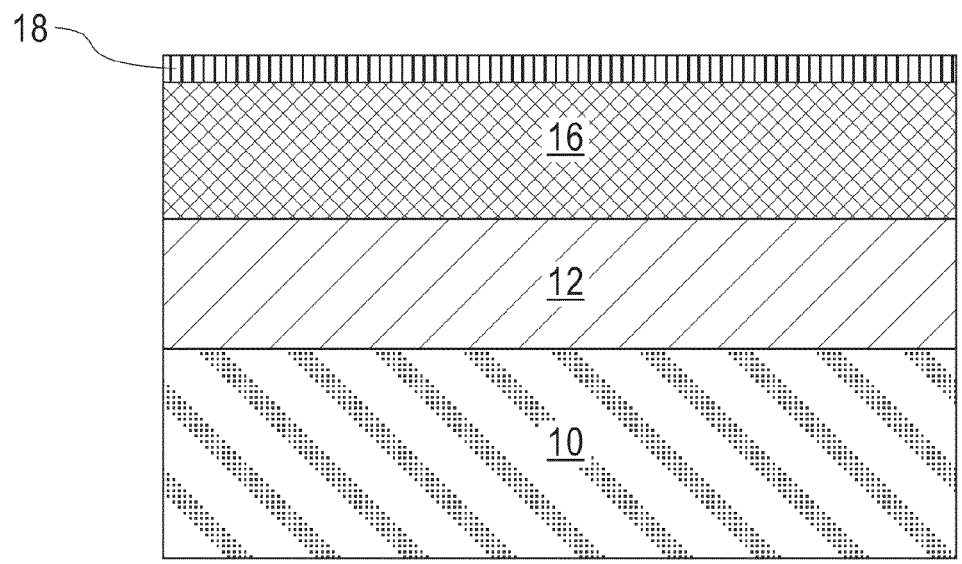
FIG. 3 is a pictorial representation (through a cross sectional view) illustrating the structure of FIG. 2 after forming a stressor layer on an exposed surface of the at least one semiconductor device-containing region.

Referring to FIG. 3, there is shown the structure of FIG. 2 after forming a stressor layer 18 on exposed surface of the least one semiconductor device-containing region 16. In some embodiments (not shown), an optional metal-containing adhesion layer can be formed on the least one semiconductor device-containing region 16 prior to forming stressor layer 18 so as to improve the adhesion of the stressor layer 18 to the at least one semiconductor device-containing region 16. Typically, the optional metal-containing adhesion layer is employed when a stressor layer 18 comprised of a metal is employed. In some embodiments, an optional plating seed layer (also not shown) can be formed directly atop the least one semiconductor device-containing region 16 prior to forming the stressor layer 18. In other embodiments, both optional layers, i.e., a metal-containing adhesion layer and a plating seed layer can be used and formed prior to the stressor layer 18.

The optional metal-containing adhesion layer that may be employed in the present disclosure includes any metal adhesion material such as, but not limited to, Ti/W, Ti, Cr, Ni or any combination thereof. The optional metal-containing adhesion layer may comprise a single layer or it may include a multi-layered structure comprising at least two layers of different metal adhesion materials.

The metal-containing adhesion layer, which may be optionally employed, can be formed utilizing deposition techniques that are well known to those skilled in the art. For example, the optional metal-containing adhesion layer can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

The optional metal-containing adhesion layer and/or the optional plating seed layer is (are) formed at a temperature which does not effectuate spontaneous spalling to occur within the base substrate 10. By "spontaneous" it is meant that the removal of a thin material layer from the base substrate 10 occurs without the need to employ any manual means to initiate crack formation and propagation for breaking apart a thin material layer from the base substrate 10. By "manual" it is meant that crack formation and propagation are explicit for breaking apart the thin material layer from the base substrate 10.

Stressor layer 18 that can be employed in the present disclosure includes any material that is under tensile stress at the spalling temperature. As such, the stressor layer 18 can also be referred to herein as a stress-inducing layer. In accordance with the present disclosure, the stressor layer 18 has a critical thickness and stress value that cause spalling mode fracture to occur within the base substrate 10. By "spalling mode fracture" it is meant that a crack is formed within base substrate 10 and the combination of loading forces maintain a crack trajectory at a depth below the uppermost surface of the base substrate 10. By "critical condition", it is meant that for a given stressor material and base substrate material combination, a thickness value and a stressor value for the stressor layer is chosen that render spalling mode fracture possible. The spalling process, conditions for spalling, and materials for spalling can include those mentioned within co-pending and commonly owned U.S. Patent Application Publication Nos. 2010/0307572, and 2010/0311250, the entire contents of which are incorporated herein by reference.

Illustrative examples of materials that are under tensile stress when applied atop the base substrate 10 and thus can be used as the stressor layer 18 include, but are not limited to, a metal, a polymer, such as a spall inducing tape layer, or any combination thereof. The stressor layer 18 may comprise a single stressor material, or a multilayered stressor structure including at least two layers of different stressor material can be employed.

In one embodiment, the stressor layer 18 is a metal. In another embodiment, the stressor layer 18 is a spall inducing tape. In another embodiment, for example, the stressor layer 18 may comprise a two-part stressor layer including a lower part and an upper part. The upper part of the two-part stressor layer can be comprised of a spall inducing tape layer.

When a metal is employed as the stressor layer 18, the metal can include, for example, Ni, Cr, Fe, and/or W. Alloys of these metals can also be employed. In one embodiment, the stressor layer 18 includes at least one layer consisting of Ni.

When a polymer is employed as the stressor layer 18, the polymer is a large macromolecule composed of repeating structural units. These subunits are typically connected by covalent chemical bonds. Illustrative examples of polymers that can be employed as the stressor layer 18 include, but are not limited to, polyimides polyesters, polyolefins, polyacrylates, polyurethane, polyvinyl acetate, and polyvinyl chloride.

When a spall inducing tape layer is employed as the stressor layer 18, the spall inducing tape layer includes any pressure sensitive tape that is flexible, soft, and stress free at a first temperature used to form the tape, yet strong, ductile and tensile at a second temperature used during spalling. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate 10 (with a lower thermal coefficient of expansion) and the tape (with a higher thermal expansion coefficient).

Typically, the pressure sensitive tape that can be employed in the present disclosure includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment and when the stressor layer 18 is a metal or polymer, the stressor layer 18 can be formed by a deposition process such as, for example, dip coating, spin-coating, brush coating, sputtering, chemical vapor deposition, plasma enhanced chemical vapor deposition, chemical solution deposition, physical vapor deposition, and/or plating. When the stressor layer 18 is a spall inducing tape layer, the spall inducing tape layer can be applied by hand or mechanical means.

If the stressor layer 18 is of a metallic nature, it typically has a thickness within a range from 3 μm to 50 μm, with a thickness within a range from 4 μm to 7 μm being more typical. Other thicknesses for a metallic stressor material that are below and/or above the aforementioned thickness ranges can also be employed in the present disclosure. If the stressor layer 18 is of a polymeric nature, it typically has a thickness in a range from 10 μm to 200 μm, with a thickness within a range from 50 μm to 100 μm being more typical. Other thicknesses for a polymeric stressor material that are below and/or above the aforementioned thickness ranges can also be employed in the present disclosure.

Figure 4:
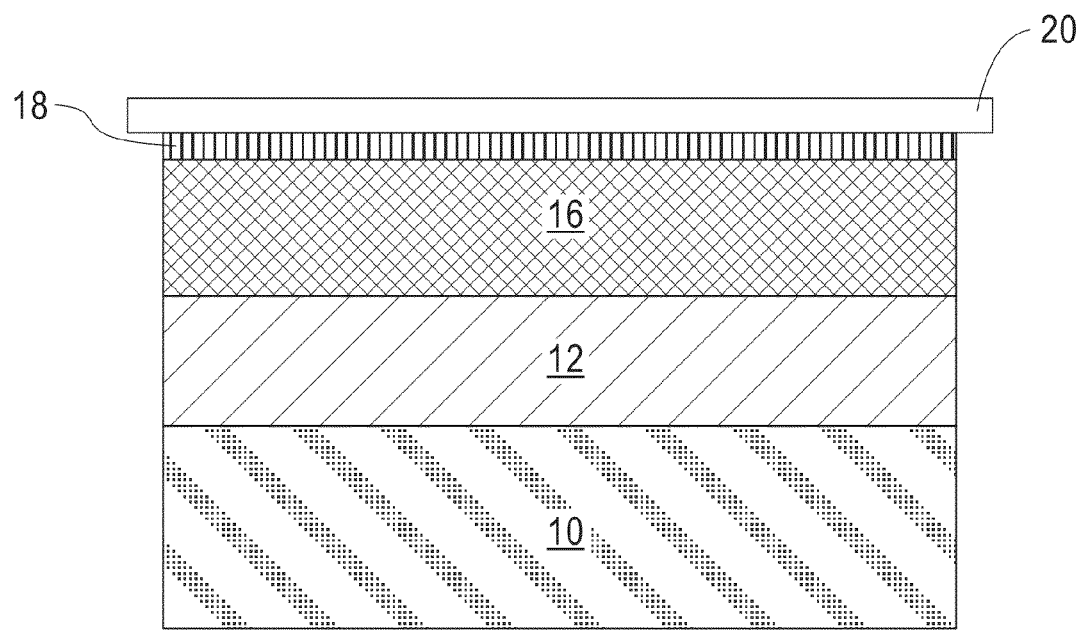
FIG. 4 is a pictorial representation (through a cross sectional view) illustrating the structure of FIG. 3 after forming a flexible handle layer on an exposed surface of the stressor layer.

Referring now to FIG. 4, there is illustrated the structure of FIG. 3 after forming a flexible handle layer 20 on an exposed surface of the stressor layer 18. In some embodiments, the flexible handle layer 20 may be omitted. The flexible handle layer 20 employed in the present disclosure comprises any flexible material which has a minimum radius of curvature that is typically less than 30 cm. Illustrative examples of flexible materials that can be employed as the flexible handle layer 20 include a metal foil or a polyimide foil. Alternatively, a tape as described above can be used as the flexible handle layer 20. The flexible handle layer 20 can be used to provide better fracture control and more versatility in handling the spalled portion of the base substrate 10. Moreover, the flexible handle layer 20 can be used to guide the crack propagation during spalling. The flexible handle layer 20 of the present disclosure is typically, but not necessarily, formed at a first temperature which is at room temperature (15° C.-40° C.).

The flexible handle layer 20 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. The flexible handle layer 20 typical has a thickness of from 1 μm to few mm, with a thickness of from 70 μm to 120 μm being more typical. Other thicknesses for the flexible handle layer 20 that are below and/or above the aforementioned thickness ranges can also be employed in the present disclosure.

Figure 5:
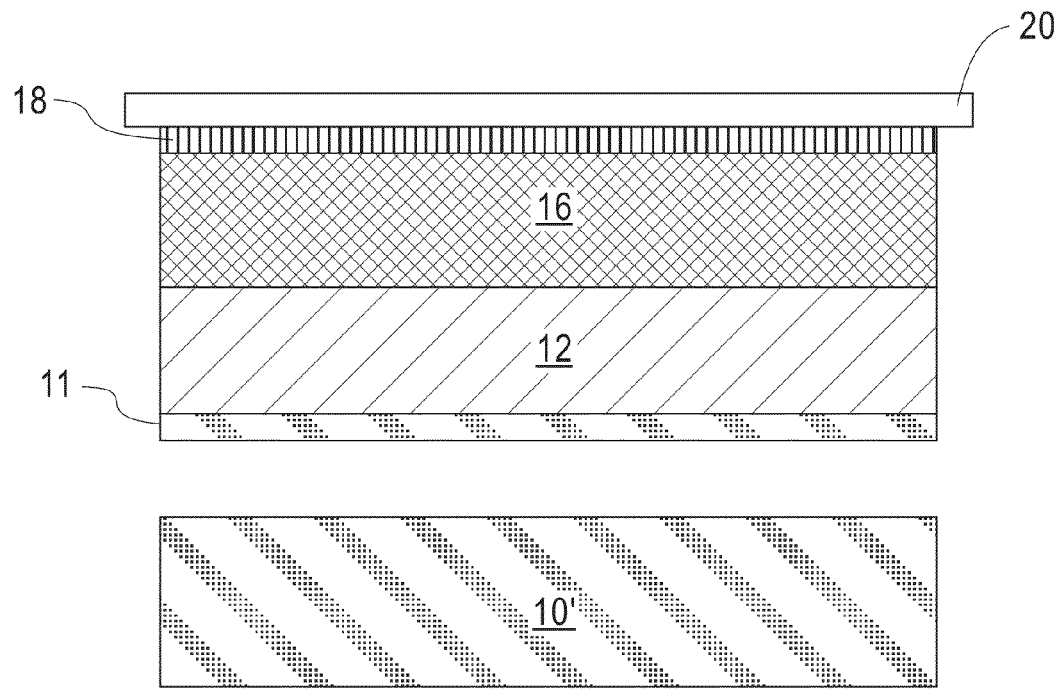
FIG. 5 is a pictorial representation (through a cross sectional view) illustrating the structure of FIG. 4 after performing a spalling process in which a portion of the base substrate of the SOI substrate is removed.

Referring now to FIG. 5, there is illustrated the structure of FIG. 4 after performing a controlled spalling process in which a portion of the base substrate 10 located beneath the buried insulator layer 12 of the SOI substrate is removed. The portion of the base substrate 10 which is no longer attached to the buried insulator layer 12 can be referred to as herein as a non-spalled portion of base substrate, which is designated by reference numeral 10' in FIG. 5. The portion of the base substrate 10 that remains attached to the buried insulator layer 12 can be referred to herein as a spalled base material layer, which is designated by reference numeral 11 in FIG. 5 In one embodiment of the present disclosure, the spalled base material layer 11 that can remain attached to the buried insulator layer 12 can have a thickness of less than 100 microns. In another embodiment, the spalled base material layer 11 that can remain attached to the buried insulator layer 12 can have a thickness of less than 50 microns. When a bulk semiconductor substrate is employed, a portion of the bulk semiconductor material remains attached to the at least one semiconductor device-containing region 16, while another portion of the bulk semiconductor substrate is unattached to the at least one semiconductor device-containing region 16.

Spalling can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure (i.e., the structure including spalled base material layer 11, the buried insulator layer 12, the at least one semiconductor device-containing region 16, the optional metal-containing adhesion layer, the optional plating seed layer, the stressor layer 18 and the flexible handle layer 20) is returned to room temperature by allowing the spalled structure to slowly warm up to room temperature by allowing the same to stand at room temperature. Alternatively, the spalled structure can be heated up to room temperature utilizing any heating means.

Figure 6:
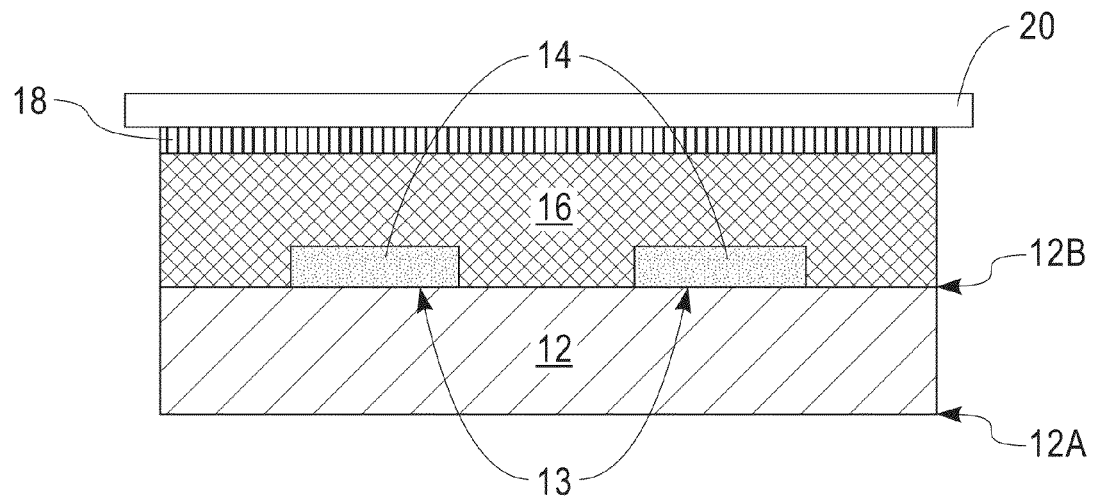
FIG. 6 is a pictorial representation (through a cross sectional view) illustrating the structure of FIG. 5 after removing a remaining portion of the base substrate exposing a bottommost surface of the buried insulator layer of the SOI substrate.

Referring now to FIG. 6, there is depicted the spalled structure of FIG. 5 after removing the spalled base material layer 11, exposing a first surface 12A (i.e., bottommost surface) of the buried insulator layer 12 of the SOI substrate which is opposite a second surface 12B (i.e., topmost surface) of the buried insulator layer 12 that forms an interface 13 with any remaining portion of SOI layer 14 that is present within the least one at least one semiconductor device-containing region 16. In some embodiments, the SOI layer 14 extends across the entirety of the buried insulator layer 12. In other embodiments, and as shown in FIG. 6, the SOI layer 14 can be partitioned into separate device regions. Interface 13 can extend the entire length of the structure, or it can be present only in selected device regions of the structure in which the SOI layer 14 remains.

In one embodiment, the removal of the spalled base material layer 11 can be performed utilizing a planarization process such as, for example, chemical mechanical polishing and/or grinding. In another embodiment, the removal of the spalled base material layer 11 can be performed utilizing an etching process such as, for example, a wet etch or a dry etch. In one embodiment, a wet etch comprising KOH, TMAH, or NaOH as a chemical etchant can be used. In still another embodiment, the removal of the spalled base material layer 11 can be performed utilizing a combined oxidation and etching process. Notwithstanding which technique is used to remove the spalled base material layer 11 from the first surface 12A of the buried insulator layer 12, the technique used stops on the first surface 12A of the buried insulator layer 12.

Figure 7A:
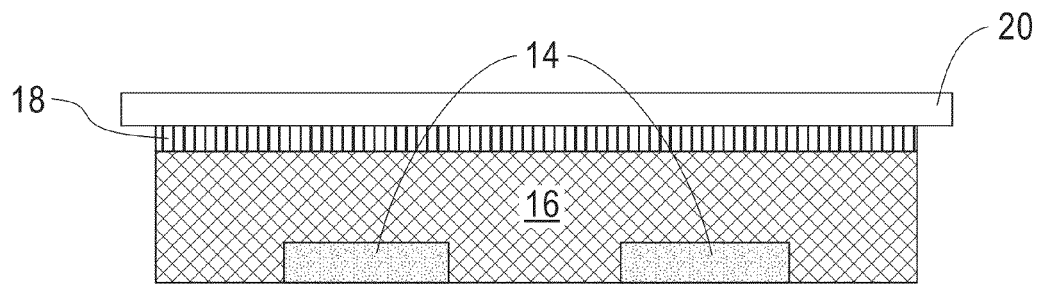
FIG. 7A is a pictorial representation (through a cross sectional view) illustrating the structure of FIG. 6 after completely removing the buried insulator layer.

Referring now to FIG. 7A, there is depicted the structure of FIG. 6 after completely removing the buried insulator layer 12 from the structure exposing at least the bottommost surface of the SOI layer 14. In one embodiment, the complete removal of the buried insulator layer 12 can be performed utilizing a planarization process such as, for example, chemical mechanical polishing and/or grinding. In another embodiment, the complete removal of the buried insulator layer 12 can be performed utilizing an etching process such as, for example, a wet etch or a dry etch. In one embodiment, a wet etch comprising hydrofluoric acid as a chemical etchant can be used to completely remove the buried insulator layer 12.

Figure 7B:
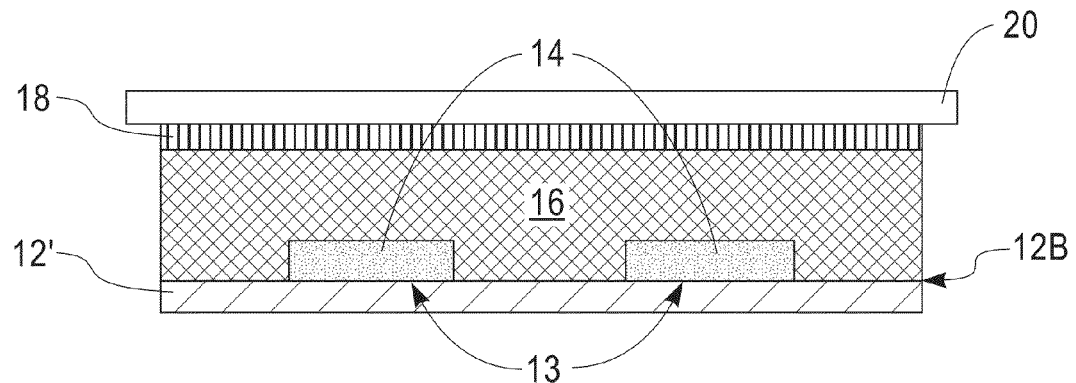
FIG. 7B is a pictorial representation (through a cross sectional view) illustrating the structure of FIG. 6 after partially removing the buried insulator layer.

Referring now to FIG. 7B, there is depicted the structure of FIG. 6 after partially removing the buried insulator layer 12 from the structure so as to thin the buried insulator layer 12 from a first thickness to a second thickness which is less than the first thickness and which does not hinder the resolution of the subsequent imaging of the at least one semiconductor-device region 16 including the at least one semiconductor device. The thinned buried insulator layer is labeled as 12' in the drawing. In one embodiment, the partial removal of the buried insulator layer 12 can be performed utilizing a planarization process such as, for example, chemical mechanical polishing and/or grinding. In another embodiment, the partial removal of the buried insulator layer 12 can be performed utilizing an etching process such as, for example, a wet etch or a dry etch. In one embodiment, a wet etch comprising hydrofluoric acid as a chemical etchant can be used to partially remove the buried insulator layer 12.

Figure 8A:
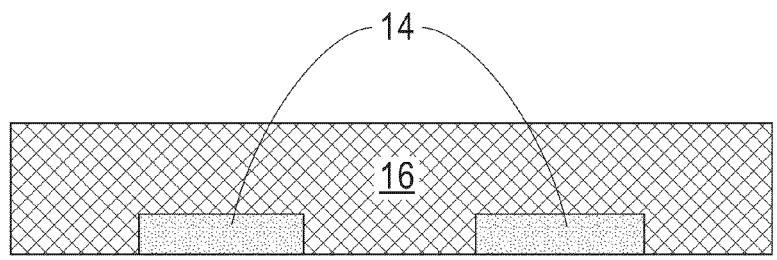
FIGS. 8A-8B are pictorial representations (through cross sectional views) illustrating the structures of FIGS. 7A and 7B, respectively, after removing the stressor layer and the flexible handle layer.
Figure 8B:
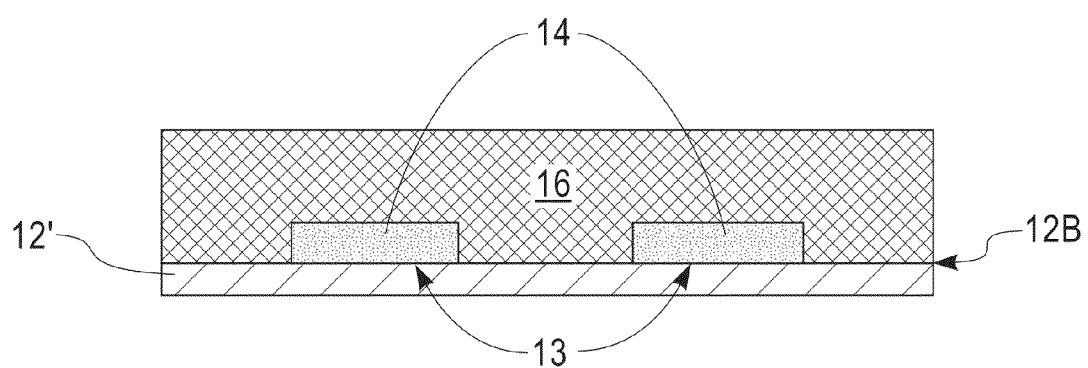

Referring to FIGS. 8A-8B, there are depicted the structure of FIGS. 7A and 7B, respectively, after removing the optional metal-containing adhesion layer, optional plating seed layer, the stressor layer 18 and the flexible handle layer 20. The flexible handle layer 20, stressor layer 18, and, if present the optional plating seed layer and the optional metal-containing adhesion layer can be removed utilizing conventional techniques well known to those skilled in the art. For example, and in one embodiment, aqua regia ($HNO_3$/$HCl$) can be used for removing the stressor layer 18, the optional plating seed layer and the optional metal-containing adhesion layer. In another example, UV or heat treatment is used to remove the flexible handle layer 20, followed by a chemical etch to remove the stressor layer 18, followed by a different chemical etch to remove the optional plating seed layer and optional metal-containing adhesion layer. The removal of the stressor layer and the flexible handle layer is optional and only required for performing plane-view imaging using transmission electron microscopy techniques (TEM).

Imaging of the at least one semiconductor-device region 16 including the at least one semiconductor device can then be performed to either the structure shown in FIG. 8A or FIG. 8B. The imaging that can be performed in the present disclosure is not limited as in prior processes in which the process of the present disclosure is not performed. In prior art processes, high-energy electron beam imaging and electron back-scattering techniques are used. In the present disclosure, imaging can be performed utilizing, for example, scanning electron beam microscopy or transmission electron microscopy. In some embodiments, the beam used in the imaging process has a beam energy that is about 1 kV or higher. It is noted that the imaging and thus the detection of the physical layout of an IC is enhanced given that the buried insulator layer and/or thick semiconductor layers are removed from the structure.

To facilitate handling, the structures shown in FIGS. 7A, 7B, 8A and 8B can be transferred to a substrate or handling frame (not shown). The handling frame can partially be in contact with the specimen around the edges to mechanically support the thin layer. The structures can be transferred to the substrate utilizing a bonding process. The substrate may be rigid or flexible and may include, for example, a semiconductor material, glass, a ceramic, or tape. Bonding can be achieved at room temperature, up to about 250° C. The bonding to the substrate may occur in the presence of, or absence of, any remaining portion of buried insulator layer 12.

Figure 9:
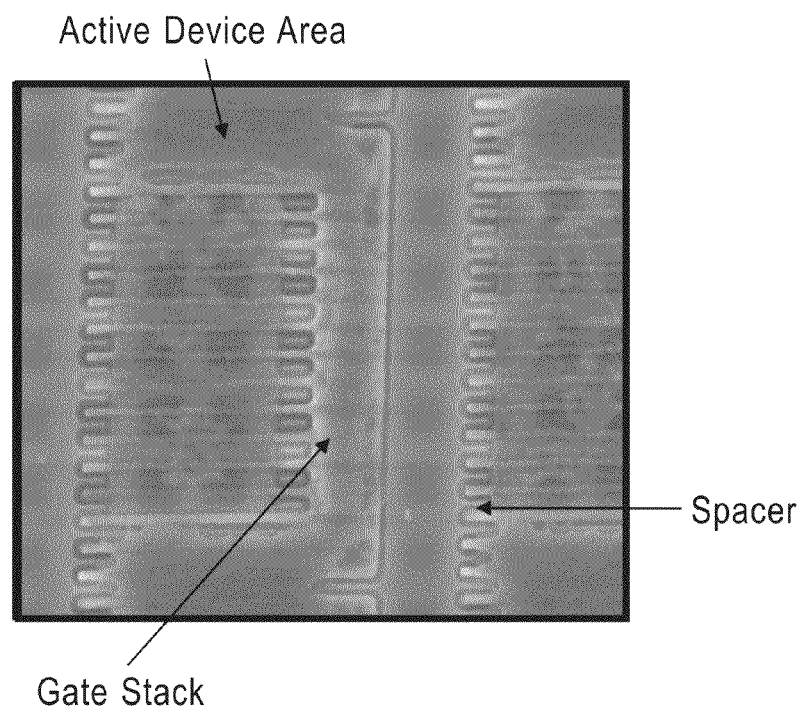
FIG. 9 shows an actual scanning electron beam microscopy image for a multi-fingered field effect transistor layout that was generated after performing the processing steps of the present disclosure.

FIG. 9 shows an actual scanning electron beam microscopy image that was generated after performing the processing steps of the present disclosure. The image shown in FIG. 9 is that for a multi-fingered field effect transistor layout.

Figure 10:
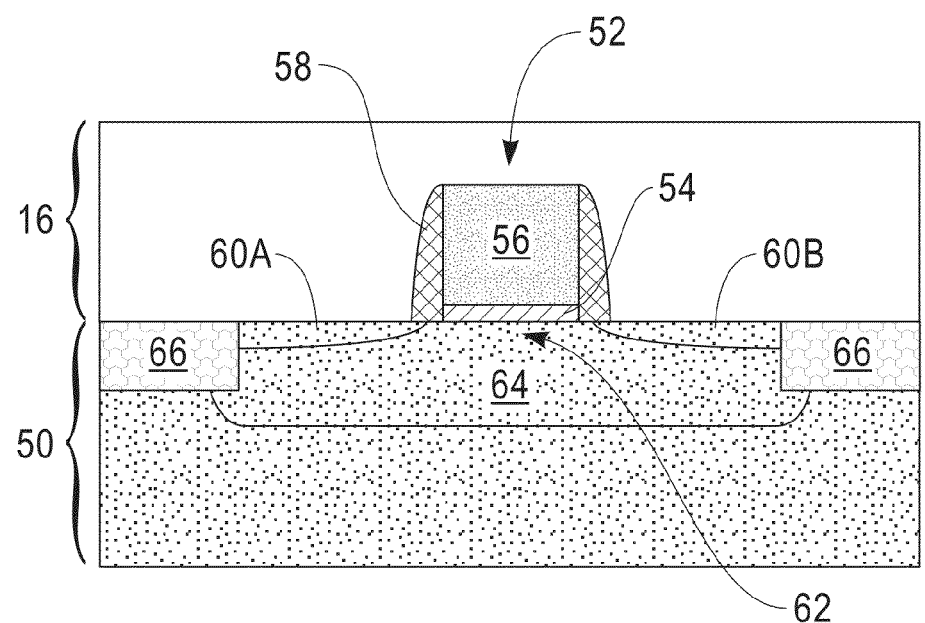
FIG. 10 is a pictorial representation (through a cross sectional view) illustrating a structure including a bulk semiconductor substrate and at least one semiconductor device located within at least one semiconductor device-containing region that can be employed in one embodiment of the present disclosure.

Reference is now made to FIG. 10 which illustrates an embodiment of the present disclosure in which a bulk semiconductor substrate 50 is employed, and at least one semiconductor device 52 is formed within at least one semiconductor device-containing region 16. Although a single semiconductor device is shown and illustrated, a plurality of semiconductor devices can be formed and used in this exemplary embodiment of the present disclosure. The at least one semiconductor device 52 is illustrated as a transistor which includes at least a gate dielectric material 54, and a gate conductor material 56 located above the gate dielectric 54. The transistor also includes an optional insulator sidewall spacer 58 located on vertical sidewalls of the gate dielectric material 54 and the gate conductor material 56. Also, present are source region 60A and drain region 60B which are connected by channel region 62. A p-well 64 is shown within the bulk substrate 50. Such a device can be formed utilizing techniques that are well known to those skilled in the art including, for example, any gate first, or gate last processing scheme.

The various materials of the semiconductor device 52 shown in FIG. 10 are well known to those skilled in the art and are not limiting. For example, the bulk semiconductor substrate 50 may include any of the semiconductor materials mentioned above for SOI layer 14.

The gate dielectric material 54 may include a semiconductor oxide, a semiconductor nitride, a semiconductor oxynitride, and/or a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric material 54 can be from 0.9 nm to 6 nm, although lesser and greater thicknesses can also be employed. The gate dielectric material 54 can be formed by any thermal technique such as, for example, oxidation or nitridration. Alternatively, the gate dielectric material 54 can be formed by a deposition method such as, for example, chemical vapor deposition (CVD), physical vapor deposition (PVD), molecular beam deposition (MBD), pulsed laser deposition (PLD), liquid source misted chemical deposition (LSMCD), and atomic layer deposition (ALD).

The gate conductor material 56 may comprise any conductive material including, for example, a doped semiconductor material, a metallic material, or any combination thereof. The gate conductor material 56 can be formed utilizing any known deposition process including, any of those mentioned above for the gate dielectric material 54. The thickness of the gate conductor material 56 can be from 20 nm to 200 nm, although lesser and greater thicknesses can also be employed.

The optional insulator sidewall spacer 58 can comprise a dielectric oxide, nitride, oxynitride, or any combination thereof. The optional insulator sidewall spacer 58 can be formed by deposition and etching.

The source region 60A and the drain region 60B can include a p-type dopant or an n-type dopant which can be introduced into the bulk semiconductor substrate 50 by ion implantation. An activation anneal may follow the ion implantation step. The source drain regions can also be formed by recessing the source drain regions and epitaxially refilling these regions. The source drain regions may contain materials that are compositionally different from the bulk semiconductor. The p-well 64 can also be formed by implanting a p-type dopant within the bulk semiconductor substrate 50.

One or more trench isolation regions 66 can be present which surround the active device area of the substrate. The one of more trench isolation regions 66 can be formed utilizing conventional techniques well known to those skilled in the art.

In addition to the above semiconductor device 52, the at least one semiconductor device-containing region 16 can include a dielectric material (not shown) atop the bulk semiconductor substrate 50 and surrounding the at least one semiconductor device 52. The dielectric material may include any intralevel and/or interlevel dielectric material including, for example, silicon dioxide, a silsesquioxane, a C doped oxide (i.e., organosilicate) that includes atoms of Si, C, O and H, thermosetting polyarylene ethers or multilayers thereof. Various conductive features (not shown) can be located within the intralevel and/or interlevel dielectric material. The conductive features can be in the form of a via, trench or combined via and trench that are filled with a conductive material such as Cu or a Cu alloy. A diffusion barrier (also not shown) can be located between the conductive material and the dielectric material that is located atop the bulk semiconductor substrate and surrounding the at least one semiconductor device. The diffusion barrier includes any known diffusion barrier material such as Ta, Ti, TaN, and/or TiN.

Figure 11:
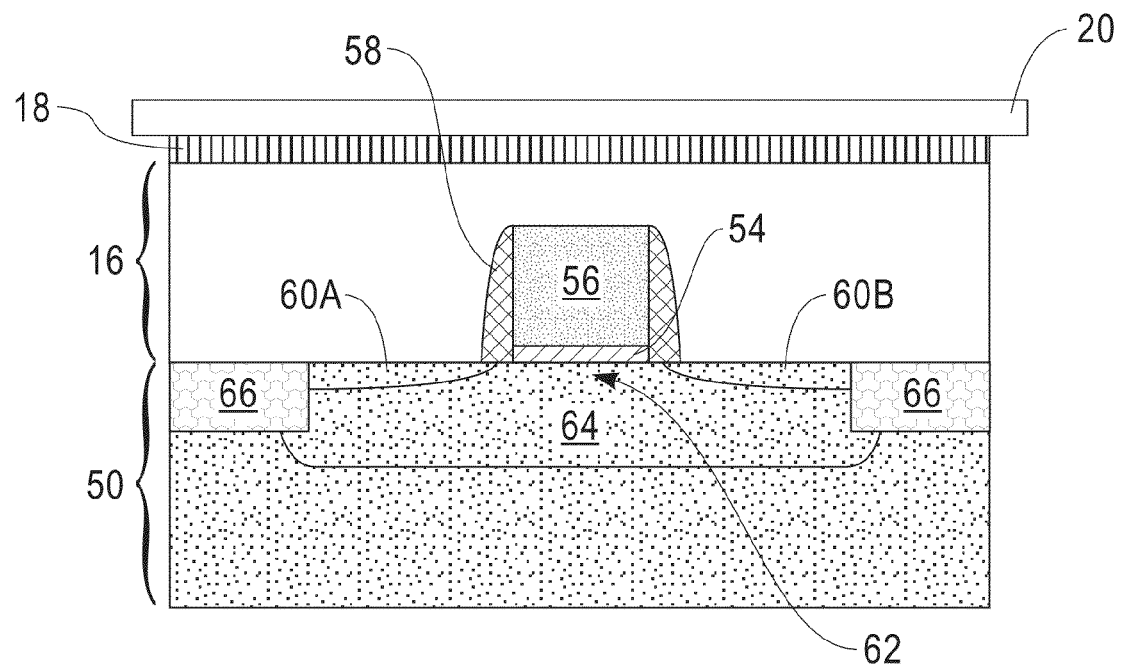
FIG. 11 is a pictorial representation (through a cross sectional view) illustrating the structure of FIG. 10 after forming a stressor layer and a flexible handle layer atop the at least one semiconductor device-containing region.

Referring now to FIG. 11, there is illustrated the structure of FIG. 10 after forming at least a stressor layer 18 and a flexible handle layer 20 on an exposed surface of the at least one semiconductor device-containing region 16. Also, an optional metal-containing adhesion layer and/or optional plating seed layer can be present between the stressor layer and the at least one semiconductor device-containing region 16.

Figure 12:
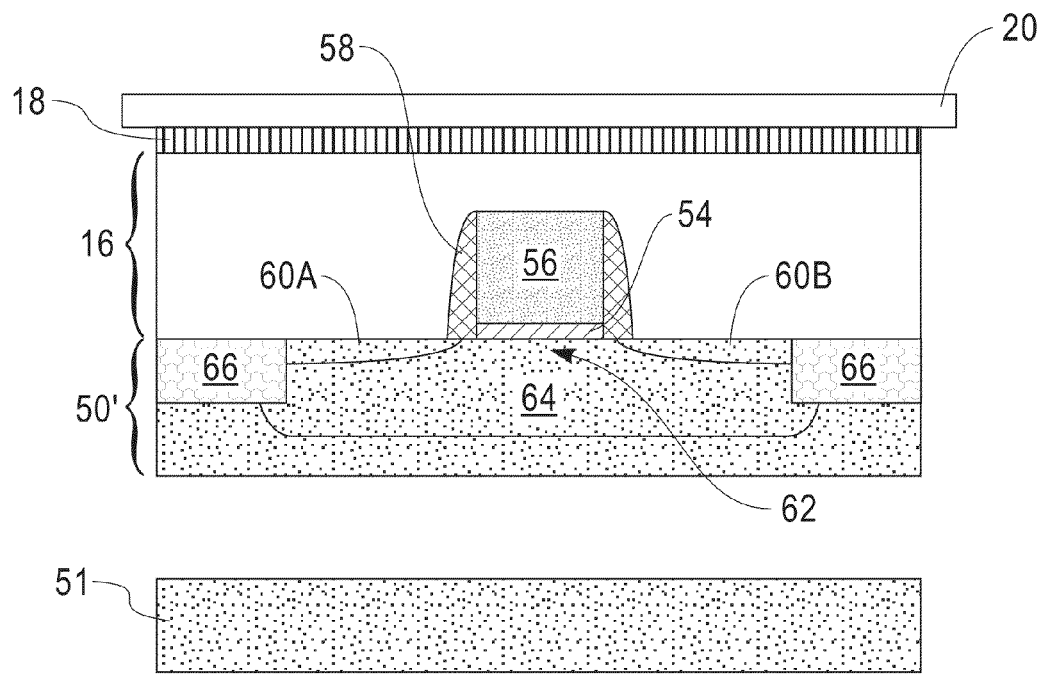
FIG. 12 is a pictorial representation (through a cross sectional view) illustrating the structure of FIG. 11 after removing a portion of the semiconductor substrate from the original substrate by spalling.

Referring now to FIG. 12, there is illustrated the structure of FIG. 11 after performing a spalling process. The spalling process employed in this embodiment includes the spalling conditions mentioned above. Spalling forms a spalled material layer 50' that remains attached to the at least one semiconductor device-containing region 16, and a non-spalled portion of the bulk semiconductor substrate 51 which is unattached to the at least one semiconductor device-containing region 16.

Figure 13:
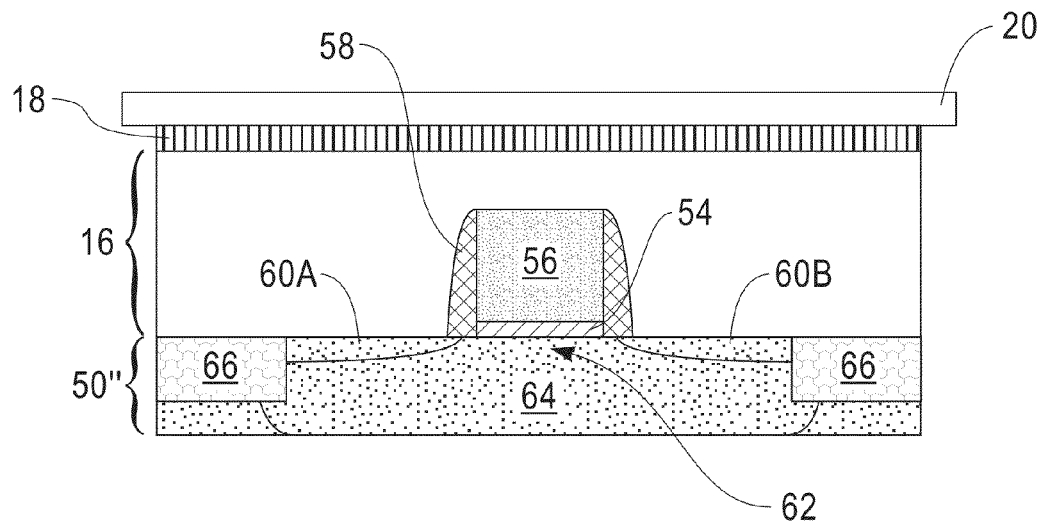
FIG. 13 is a pictorial representation (through a cross sectional view) illustrating the structure of FIG. 12 after performing an etching process which thins the portion of the semiconductor substrate that was removed from the original substrate.

Referring now to FIG. 13, there is illustrated the structure of FIG. 12 after etching a portion of the spalled material layer 50' from the structure providing a thinned spalled material layer 50". The etching is performed utilizing a selective wet etch process such as, for example, TMAH utilizing the bottommost surface of p-well 64 as an end point detection means.

The stressor layer 18, flexible handle layer 20, the optional metal-containing adhesion layer, and the optional platting seed layer can be optionally removed from the structure shown in FIG. 13 utilizing the techniques mentioned above for removal of those layers from the structure of the first embodiment of the present disclosure. The resultant structure is then subjected to plane-view TEM imaging as described above. The removal of the flexible handle layer 20 and the stressor 18 is not required for imaging using SEM or for performing material characterization techniques.

In some embodiments, a p-doped semiconductor layer can be formed between a top semiconductor material and a bottom semiconductor material. The p-doped semiconductor layer and the top semiconductor layer can be formed by epitaxial growth (to be defined in greater detail herein below). The bottom semiconductor layer, top semiconductor layer and the p-doped layer can all comprise a same or different semiconductor material. In such an embodiment, the p-doped semiconductor layer can serve as an etch stop layer much the same way that the p-well region.

Figure 14:
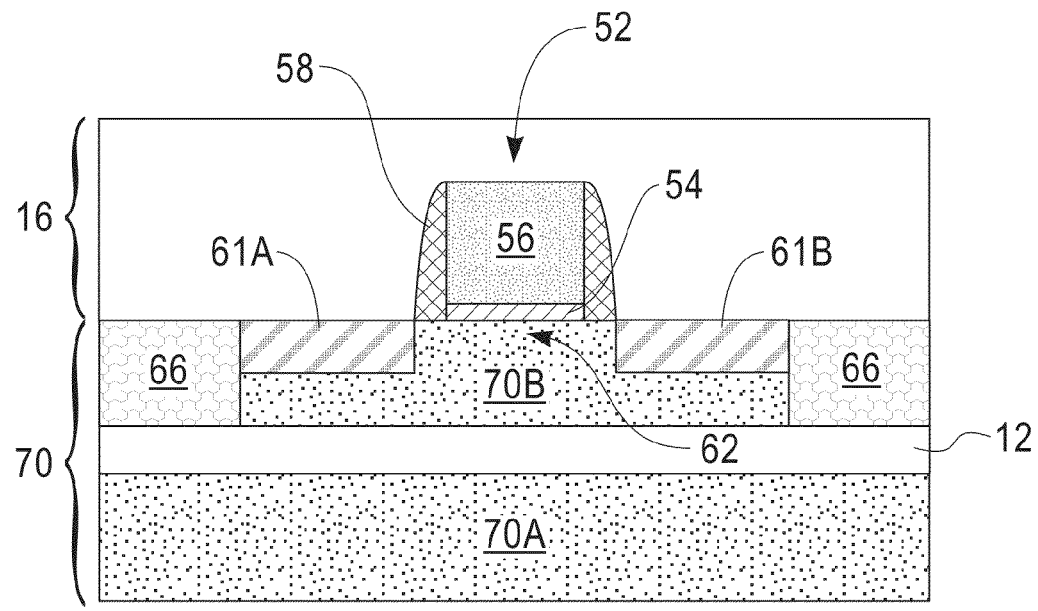
FIG. 14 is a pictorial representation (through a cross sectional view) illustrating a structure including a partially depleted semiconductor-on-insulator (PDSOI) substrate and at least one semiconductor device located within at least one semiconductor device-containing region that can be employed in one embodiment of the present disclosure.

Referring now to FIG. 14, there is illustrated another embodiment of the present disclosure in which a PDSOI substrate 70 is employed, and at least one semiconductor device 52 is formed within at least one semiconductor device-containing region 16. The PDSOI substrate 70 includes a base substrate 70A, an insulator layer 12 and a top semiconductor active layer 70B. The base substrate 70A and the top semiconductor active layer 70B include materials and thicknesses as mentioned above for base substrate 10 and top semiconductor active layer 14. The top semiconductor active layer 70B includes the at least one semiconductor device 52 formed thereon and/or therein. Although a single semiconductor device is shown and illustrated, a plurality of semiconductor devices can be formed and used in this exemplary embodiment of the present disclosure. The at least one semiconductor device 52 is illustrated as a transistor which includes at least a gate dielectric material 54, a gate conductor material 56 located above the gate dielectric 54. The transistor also includes an optional insulator sidewall spacer 58 located on vertical sidewalls of the gate dielectric material 54 and the gate conductor material 56. Also, present are an embedded first region of semiconductor material 61A and an embedded second region of semiconductor material 61B which are connected by channel region 62. Such a device can be formed utilizing techniques that are well known to those skilled in the art including, for example, any gate first, or gate last processing scheme. Also, this embodiment can be used in cases in which the PDSOI substrate 70 is replaced with a bulk substrate.

In this embodiment, the same device elements as mentioned above for FIG. 10 are present except for the embedded first region of semiconductor material 61A and the embedded second region of semiconductor material 61B. The embedded first and second regions of semiconductor material 61A, 61B are used as source/drain regions in this embodiment of the present disclosure. The embedded first and second regions of semiconductor material 61A, 61B are formed by first forming trenches within the top semiconductor active layer 70B and then filling the trenches with a semiconductor material having a lattice constant that differs from that of the original semiconductor material of the top semiconductor active layer 70B.

The semiconductor material that can be epitaxially deposited within the trenches includes any semiconductor material such as, for example, silicon (Si), germanium (Ge), and silicon germanium (SiGe), silicon carbon (SiC) provided that the semiconductor material that is epitaxially grown has a lattice constant that differs from that of the bulk semiconductor substrate. It is noted that the these specific material compositions for the epitaxial semiconductor material are provided for illustrative purposes only, and are not intended to limit the present disclosure, as any semiconductor material that may be formed using an epitaxial growth process can be employed in the present disclosure. A number of different sources may be used for the deposition of epitaxial silicon. In some embodiments, in which the epitaxial semiconductor material is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the epitaxial semiconductor material is of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the epitaxial semiconductor material is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

A dopant (i.e., n-type dopant or p-type dopant) can be introduced into the source gases during the epitaxial growth process itself. Alternatively, the dopant can be introduced into the epitaxial grown material after the epitaxial growth process utilizing conventional techniques such as for example, ion implantation and gas phase doping.

Figure 15:
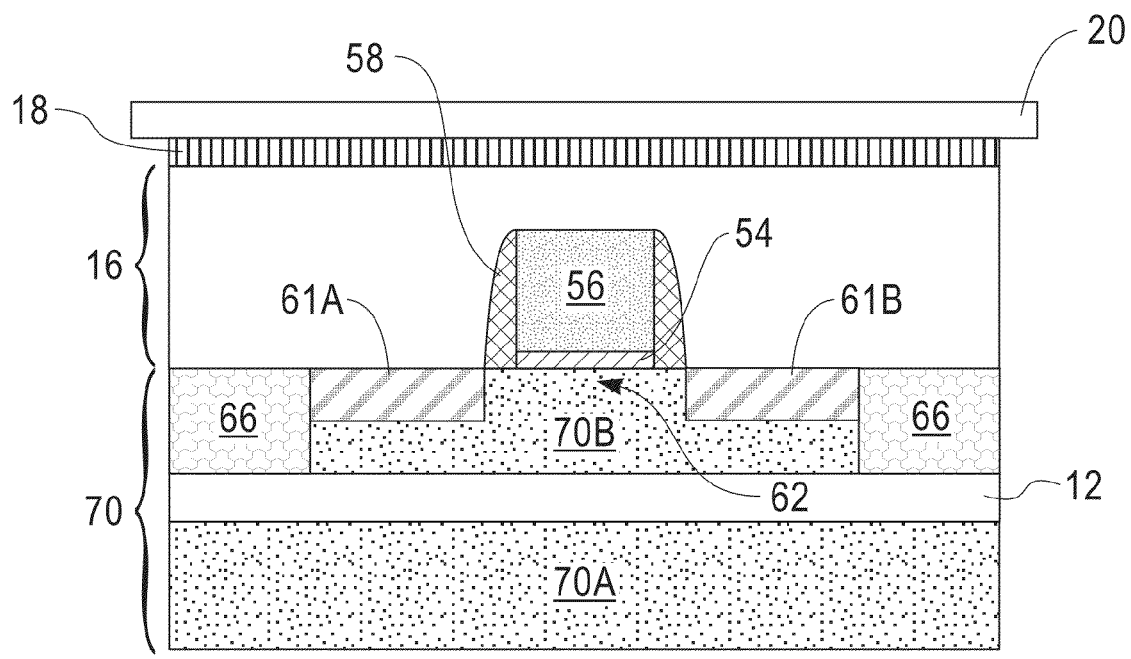
FIG. 15 is a pictorial representation (through a cross sectional view) illustrating the structure of FIG. 14 after forming a stressor layer and a flexible handle layer atop the at least one semiconductor device-containing region.

Referring now to FIG. 15, there is illustrated the structure of FIG. 14 after forming at least a stressor layer 18 and a flexible handle layer 20 on an exposed surface of the at least one semiconductor device-containing region 16. Also, an optional metal-containing adhesion layer and/or optional plating seed layer can be present between the stressor layer and the at least one semiconductor device-containing region 16.

Figure 16:
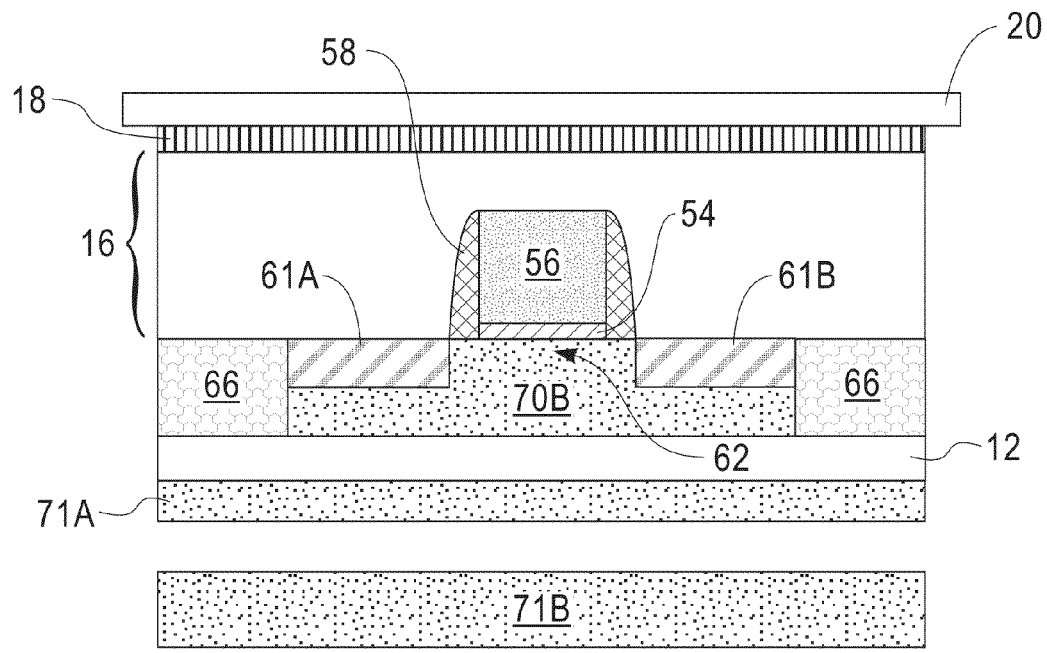
FIG. 16 is a pictorial representation (through a cross sectional view) illustrating the structure of FIG. 15 after removing a portion of the semiconductor substrate from the original substrate by spalling.

Referring now to FIG. 16, there is illustrated the structure of FIG. 15 after performing a controlled spalling process. The spalling process employed in this embodiment includes the spalling conditions mentioned above. Spalling forms a spalled material layer 71A that remains attached to the buried insulator layer 12 that is connected at least one semiconductor device-containing region 16, and a non-spalled portion of the bulk semiconductor substrate 71B which is unattached to the at least one semiconductor device-containing region 16.

Figure 17:
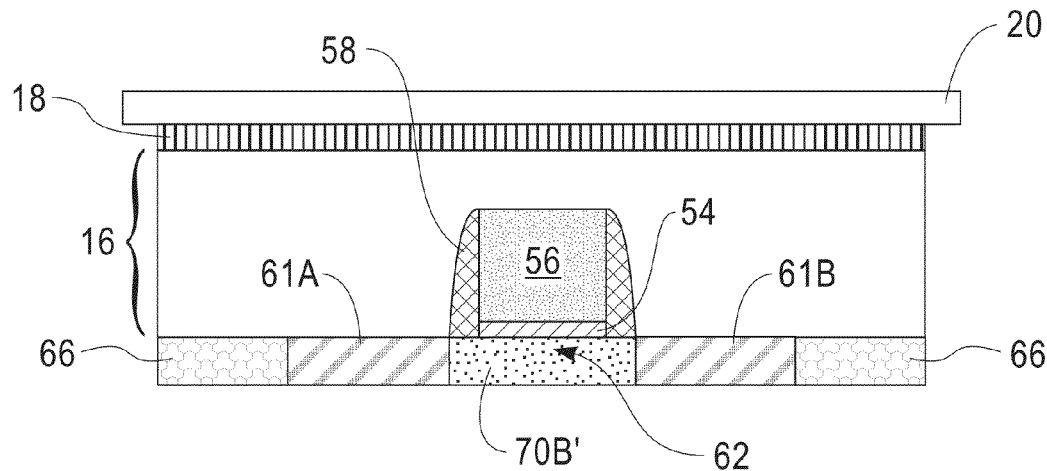
FIG. 17 is a pictorial representation (through a cross sectional view) illustrating the structure of FIG. 16 after performing an etching process which thins the portion of the semiconductor substrate that was removed from the original substrate.

Referring now to FIG. 17, there is illustrated the structure of FIG. 16 after removing the spalled material layer 71A and the buried insulator layer 12 from the structure. The spalled material layer 71A can be removed as described above. The buried insulator layer 12 can be removed from the structure using a wet or dry etch as described above; a portion of the top semiconductor active layer 70B can also be removed from the structure providing a thinned top semiconductor active layer 70B'. The etching is performed utilizing a dry etch process with an end-point detection that can detect the material content of the source drain region and use the species that is different from the top semiconductor active layer 70B as an end-point. During this etch, some portion of the trench isolation regions 66 can also be removed.

The stressor layer 18, flexible handle layer 20, the optional metal-containing adhesion layer, and the optional platting seed layer can be removed from the structure shown in FIG. 17 utilizing the techniques mentioned above for removal of those layers from the structure of the first embodiment of the present disclosure. The resultant structure is then subjected to imaging as described above.

In any of the above embodiments, other material characterization techniques can be applied to detect different information from the back of the circuit including material composition and strain type and level. The other material characterization techniques may include, but are not limited to, secondary mass spectroscopy, x-ray diffraction, or Rutherford back scattering.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for enhancing the recognition of an integrated circuit, said method comprising:
    forming at least one semiconductor device-containing region comprising at least one semiconductor device formed on and/or within a portion of a semiconductor substrate, wherein said at least one semiconductor device comprises a source region and a drain region located within a semiconductor material layer of said semiconductor substrate;
    providing at least a stressor layer on an exposed surface of said at least one semiconductor device-containing region, wherein said stressor layer has a fracture toughness that is greater than that of said semiconductor substrate;
    applying a flexible handle layer on an exposed surface of said stressor layer;
    removing a material semiconductor layer from said semiconductor substrate by spalling, wherein said material semiconductor layer is attached to said at least one semiconductor device-containing region;
    exposing a bottommost surface of each of said source region and said drain region; and
    imaging the at least one semiconductor device-containing region including said at least one semiconductor device.

2. The method of claim 1, wherein said providing the stressor layer comprises selecting a metal, a polymer or any combination.

3. The method of claim 2, wherein said providing the stressor layer comprises selecting a spall inducing tape as said polymer.

4. The method of claim 1, wherein said providing the stressor layer comprises selecting Ni as a stress inducing layer and forming a pressure sensitive tape on an exposed surface of said Ni.

5. The method of claim 1, wherein said spalling is performed at room temperature or a temperature of less than room temperature.

6. The method of claim 1, wherein said imaging comprises scanning electron beam microscopy, or transmission electron microscopy.

7. The method of claim 1, further comprising performing a material characterization method to determine material composition, strain level and type or doping profile.

8. The method of claim 1, wherein said imaging is performed utilizing a beam energy that is about 1 kV or more.

9. The method of claim 1, further comprising removing at least said stressor layer and the flexible handle layer from atop the at least one semiconductor device-containing region prior to said imaging.

10. The method of claim 1, further comprising forming at least one of a metal-containing adhesion layer and a plating seed layer prior to providing the stressor layer.

11. The method of claim 1, wherein said semiconductor substrate is a bulk semiconductor substrate.

12. The method of claim 1, wherein said semiconductor substrate is a semiconductor-on-insulator substrate including a stack, from bottom to top, of a base substrate, a buried insulator layer, and a top semiconductor active layer, wherein said at least one semiconductor device is formed in a portion of said top semiconductor active layer, and wherein after removing said material semiconductor layer a bottommost surface of said buried insulator layer is exposed, and wherein said buried insulator layer is removed prior to said imaging.

13. The method of claim 12, wherein said buried insulator layer comprises boron nitride or a dielectric metal oxide.

14. The method of claim 12, wherein said top semiconductor active layer has a thickness from 2 nm to 3000 nm.

15. The method of claim 1, wherein said flexible handle layer has a minimum radius of curvature of less than 30 cm.

* * * * *